(12) United States Patent
Nirschl et al.

(10) Patent No.: US 8,509,007 B2
(45) Date of Patent: Aug. 13, 2013

(54) HYBRID READ SCHEME FOR MULTI-LEVEL DATA

(75) Inventors: Thomas Nirschl, Putzbrunn (DE); Nigel Chan, Dresden (DE); Jan Otterstedt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/405,523

(22) Filed: Feb. 27, 2012

(65) Prior Publication Data

US 2012/0170386 A1    Jul. 5, 2012

(51) Int. Cl.
*G11C 7/06* (2006.01)
*G11C 16/04* (2006.01)
*G11C 16/06* (2006.01)

(52) U.S. Cl.
USPC ............ 365/189.07; 365/185.03; 365/185.18; 365/185.21

(58) Field of Classification Search
USPC .................................................. 365/189.07
See application file for complete search history.

(56) References Cited

U.S. PATENT DOCUMENTS

| | | | |
|---|---|---|---|
| 5,043,940 A | 8/1991 | Harari | |
| 5,172,338 A | 12/1992 | Mehrotra et al. | |
| 5,508,958 A | 4/1996 | Fazio et al. | |
| 5,594,691 A * | 1/1997 | Bashir | 365/185.03 |
| 6,034,888 A * | 3/2000 | Pasotti et al. | 365/185.03 |
| 6,870,772 B1 * | 3/2005 | Nitta et al. | 365/185.22 |
| 6,961,266 B2 * | 11/2005 | Chang | 365/185.03 |
| 8,040,714 B2 * | 10/2011 | Choi et al. | 365/148 |
| 2006/0221712 A1 * | 10/2006 | Lowrey et al. | 365/189.01 |
| 2011/0261626 A1 * | 10/2011 | Kim | 365/185.22 |
| 2012/0106258 A1 * | 5/2012 | Takahashi | 365/185.21 |
| 2012/0250400 A1 * | 10/2012 | Katayama | 365/158 |

OTHER PUBLICATIONS

Bleiker, Christoph, et al., "A Four-State EEPROM Using Floating-Gate Memory Cells", IEEE Journal of Solid-State Circuits, vol. sc-22, No. 3, Jun. 1987, p. 460-463.

* cited by examiner

*Primary Examiner* — Son Mai
(74) *Attorney, Agent, or Firm* — Eschweiler & Associates, LLC

(57) ABSTRACT

Some aspects of the present disclosure relate to a read circuit that uses a hybrid read scheme as set forth herein. In this hybrid read scheme, a state machine, at a first time in the read operation, sets a reference signal $S_{Ref}$ to a first reference value to induce determination of a first comparison result. At a second subsequent time in the read operation, the state machine sets the reference signal $S_{Ref}$ to a second reference value, which is based on the first comparison result. Setting the reference signal to the second reference value induces determination of a second comparison result. The first and second comparison results are then used to determine the digital value read from the memory cell.

21 Claims, 8 Drawing Sheets

US 8,509,007 B2

HYBRID READ SCHEME FOR MULTI-LEVEL DATA

BACKGROUND

Memory devices have storage capacities that are strongly linked to Moore's law, which states that the number of transistors on integrated circuits doubles approximately every 18 months. This rapid increase in storage capacity is due, in part, to a reduction in feature size for transistors and/or other devices on the memory devices. However, reduction in feature size is not the only factor leading to the increase in memory storage density. Another contributing factor is architectural changes made to the individual memory cells and/or the overall memory device. One architectural change is the movement from single bit memory cells (which each store a single bit of data, i.e., a "0" or a "1") to multi-state memory cells (which are each capable of storing more than one bit of data).

Although multi-state memory cells potentially provide an increase in storage density for memory devices, it is more difficult to read data from a multi-state memory cell, relative to a single-bit memory cell. Traditional solutions require either large amounts of hardware or suffer from slow read times when interfacing with multi-state memory cells, and are therefore less than optimal. Therefore, the present disclosure provides for improved techniques for reading data from multi-state memory cells.

DETAILED DESCRIPTION

Figure 1:
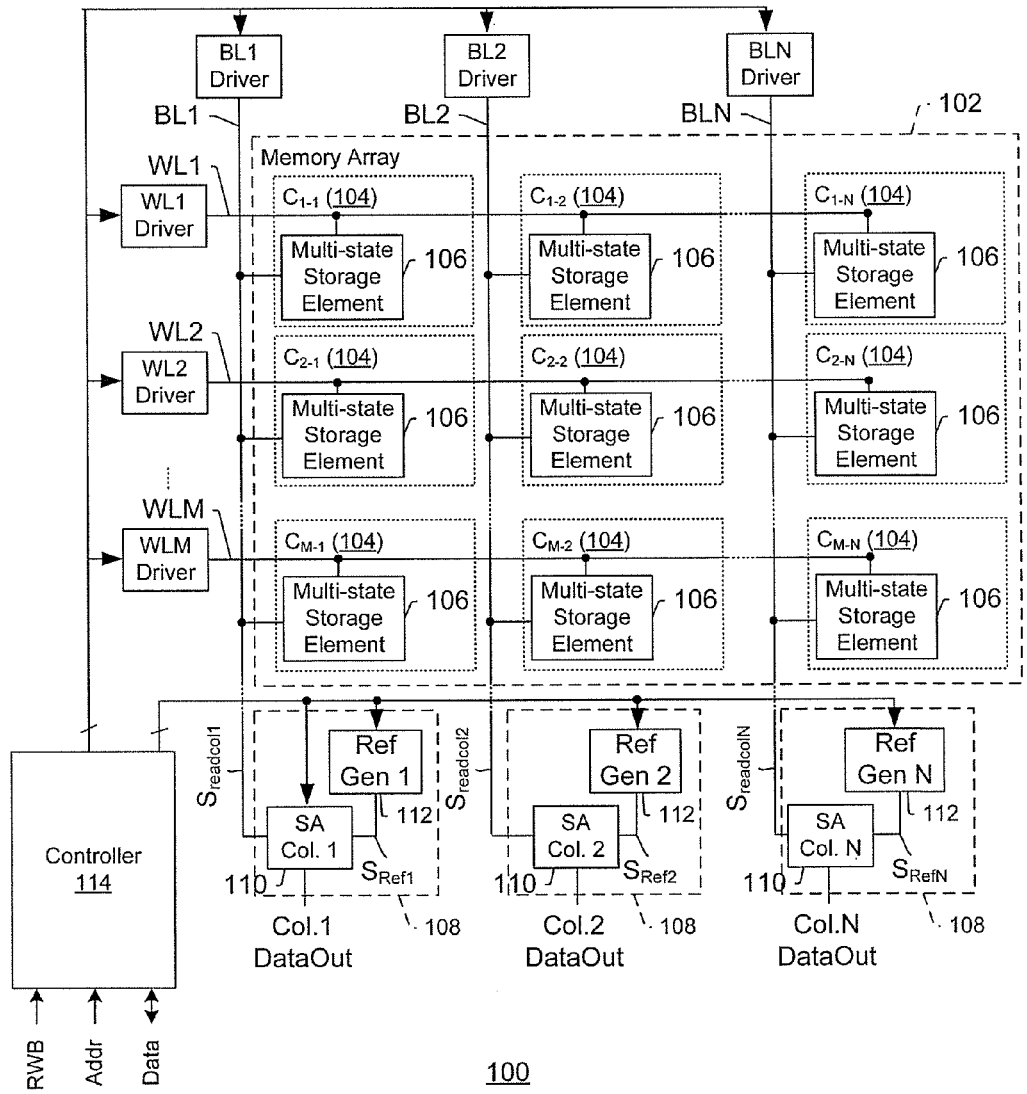
FIG. 1 is a block diagram of a memory device that includes read circuitry to efficiently read data from multi-state memory storage elements in accordance with some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

FIG. 1 illustrates a memory device 100, which includes a memory array 102, in accordance with some embodiments. In this example, the memory array 102 is made up of N×M memory cells 104 arranged in M rows (words) and N columns (bits), wherein individual cells are labeled as $C_{ROW-COLUMN}$. Each memory cell 104 includes a multi-state storage element 106 that is capable of storing three or more data states therein, wherein the memory cells 104 are accessible via wordlines (WL) and bitlines (BL). Read circuits 108 (which can include sense amps S/A 110 and reference generators 112) are associated with respective columns, and are configured to output digital data read from accessed memory cells. In particular, the sense amps 110 can compare read data values, $S_{readcol1}, \ldots S_{readcolN}$, (which correspond to to-be-determined data states read from respective accessed memory cells) to respective reference signals $S_{Ref1}, \ldots S_{RefN}$, provided by respective reference generators 112, to determine respective multi-bit digital values read Col.1DataOut, . . . Col.N DataOut, from the respective memory cells. As will be appreciated in greater detail below, the read circuits 108 can use a hybrid read scheme that provides good tradeoffs between cost, performance, and power consumption.

Although FIG. 1 shows an embodiment where each column has a read circuit 108 with a corresponding sense amp 110 and a corresponding reference generator 112, other configurations are also possible. In other embodiments, sense amps 110 and/or their reference generators 112 can be shared between two or more columns (e.g., via a multiplexer) and there need not be a one-to-one correspondence there between as shown in FIG. 1. Further, in some embodiments, the reference generators 112 can be global reference lines that provide multiple reference signals to the respective sense amplifiers 110, and/or a single reference line can provide a base reference signal from which the reference generators 112 generate additional reference signals.

Figure 2:
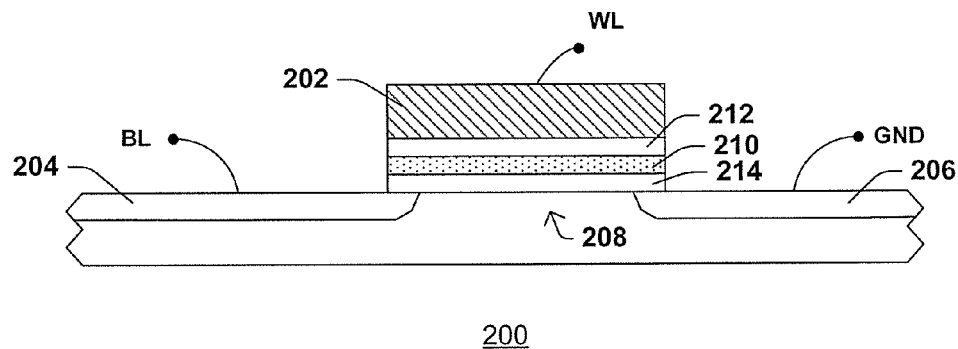
FIG. 2 is a cross-sectional diagram of a flash memory cell, which is an example of a multi-state memory storage element consistent with FIG. 1.

In some embodiments, each multi-storage storage element 106 can include a three terminal device having a control terminal whose voltage level controls the amount of current, if any, flowing between the other two terminals. One non-limiting example of a three-terminal multi-state storage element is a flash memory cell, such as shown in FIG. 2 for example. Flash memory cell 200 has a first terminal 202 in the form of a control gate (CG) coupled a wordline (WL); as well as second and third terminals (204, 206, respectively) in the form of source and drain regions. The CG is arranged over a channel region 208, which extends between the source and drain regions, and is electrically isolated there from. A floating gate (FG) 210 is arranged between the channel region 208 and CG 202, and is electrically isolated from these components by dielectrics 212 and 214. Because the FG 210 is electrically isolated by dielectric layers 212 and 214, any electrons placed on the FG 210 are trapped there and, under normal conditions, will not discharge for an extended time period (e.g., months or years). When the FG 210 holds a charge, it screens (partially cancels) the electric field from the CG 202, which modifies the threshold voltage ($V_T$) of the flash memory cell 200. During read-out, a control voltage is applied to the CG 202, and the channel region 208 will become conducting or remain insulating, depending on the $V_T$ of the cell, which is in turn controlled by charge on the FG 210. In a multi-level cell device, which stores more than one bit per cell, the threshold voltage of the cell can be sensed by measuring the amount of current flowing between source 204 and drain 206 in order to determine more precisely the level of charge on the FG 210. Additionally, this measurement can be repeated with different voltages $V_{CG}$.

Figure 3:
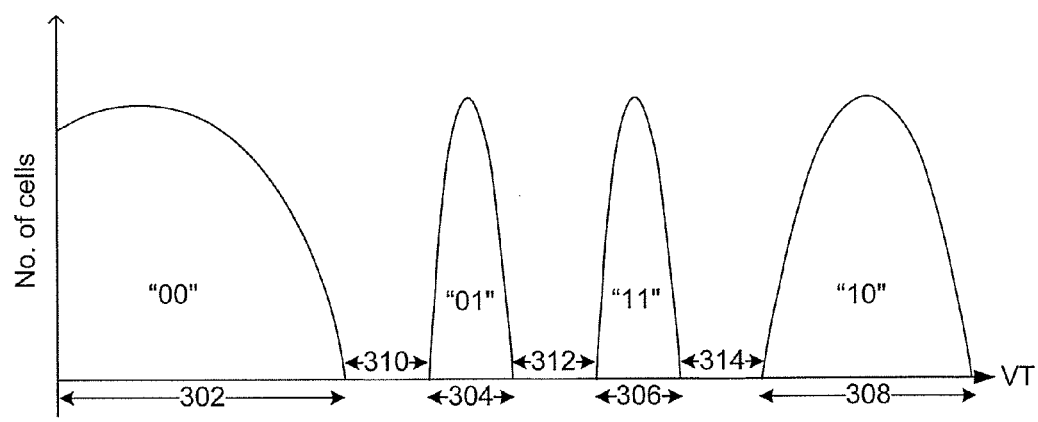
FIG. 3 is a voltage threshold distribution for an array of multi-state memory cells.

FIG. 3 shows a sample voltage threshold distribution 300 for an array of multi-state memory cells (e.g., an array of flash memory cells 200). In this example, the multi-state memory cells include four states, but could also include any number of states greater than two in other embodiments. As shown, the $V_T$s of the memory cells fall into four data states (e.g., 302, 304, 306, 308), wherein guard bands or forbidden regions (310, 312, 314) separate adjacent states from one another. For clarity of understanding, the states in FIG. 3 are labeled "00", "01", "11", and "10", although these encodings are somewhat arbitrary and other encoding schemes could be used. Conventional memory devices are unable to differentiate between these states while maintaining a good blend of low-power consumption and high performance (e.g., fast read operations). Therefore, the present disclosure provides a hybrid read scheme that offers good tradeoffs between cost, performance and low-power consumption.

Figure 4:
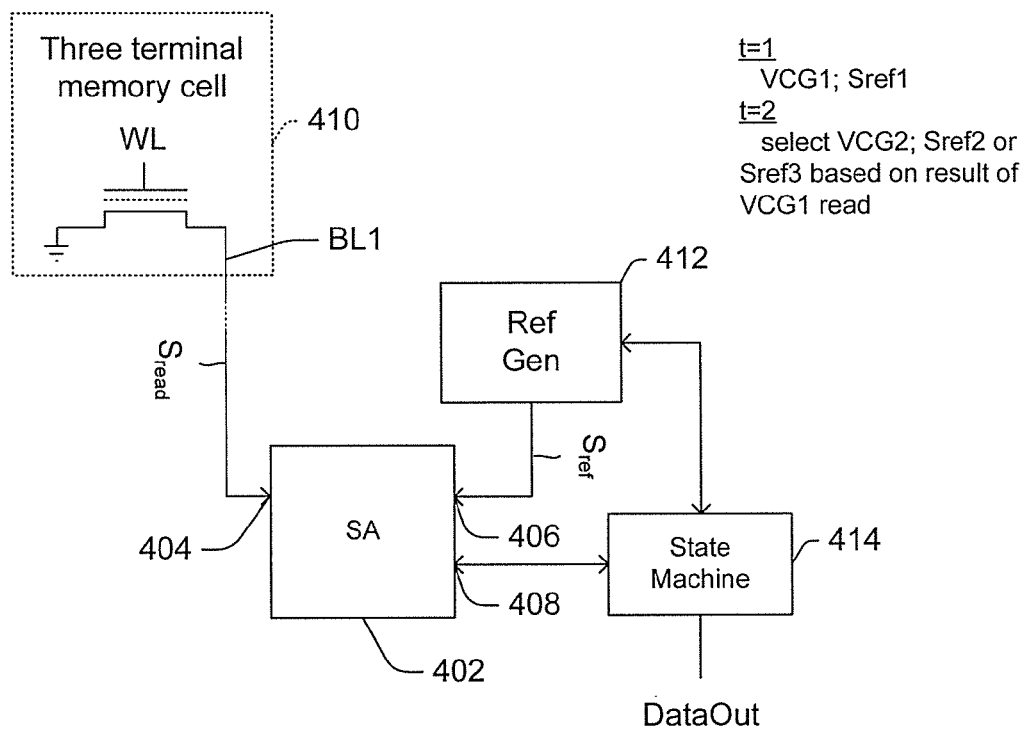
FIG. 4 is a block diagram of a read circuit for reading multi-state data in accordance with some embodiments.

Turning now to FIG. 4, one can see a read circuit 400 for reading a multi-state memory cell in accordance with some embodiments. The read circuit 400 includes a sense amplifier 402 including first and second sense terminals (404, 406) and an output terminal 408. The first sense terminal 404 is selectively coupled to a bitline of an accessed cell 410 and receives a read signal, $S_{read}$, thereon, wherein the read signal is indicative of a to-be-determined state read from the accessed cell 410. The second sense terminal 406 is coupled to a reference generator 412, and receives a series of reference signals, $S_{ref}$, which are used to help differentiate between different possible data states that correspond to the to-be-determined state read from the cell 410. The output terminal 408 is coupled to a state machine 414, such as a control circuit arranged on the same integrated circuit as the memory array (e.g., controller 114 in FIG. 1).

To provide good tradeoffs and alleviate the shortcomings of conventional solutions, the read circuit 400 uses a hybrid read scheme as set forth herein. In this hybrid read scheme, the state machine 414, at a first time in the read operation, sets the reference signal $S_{Ref}$ to a first reference value to induce determination of a first comparison result. At a second subsequent time in the read operation, the state machine sets the reference signal $S_{Ref}$ to a second reference value, which is based on the first comparison result. Setting the reference signal to the second reference value induces determination of a second comparison result. The first and second comparison results are then used to determine the digital value read from the memory cell 410.

Figure 5:
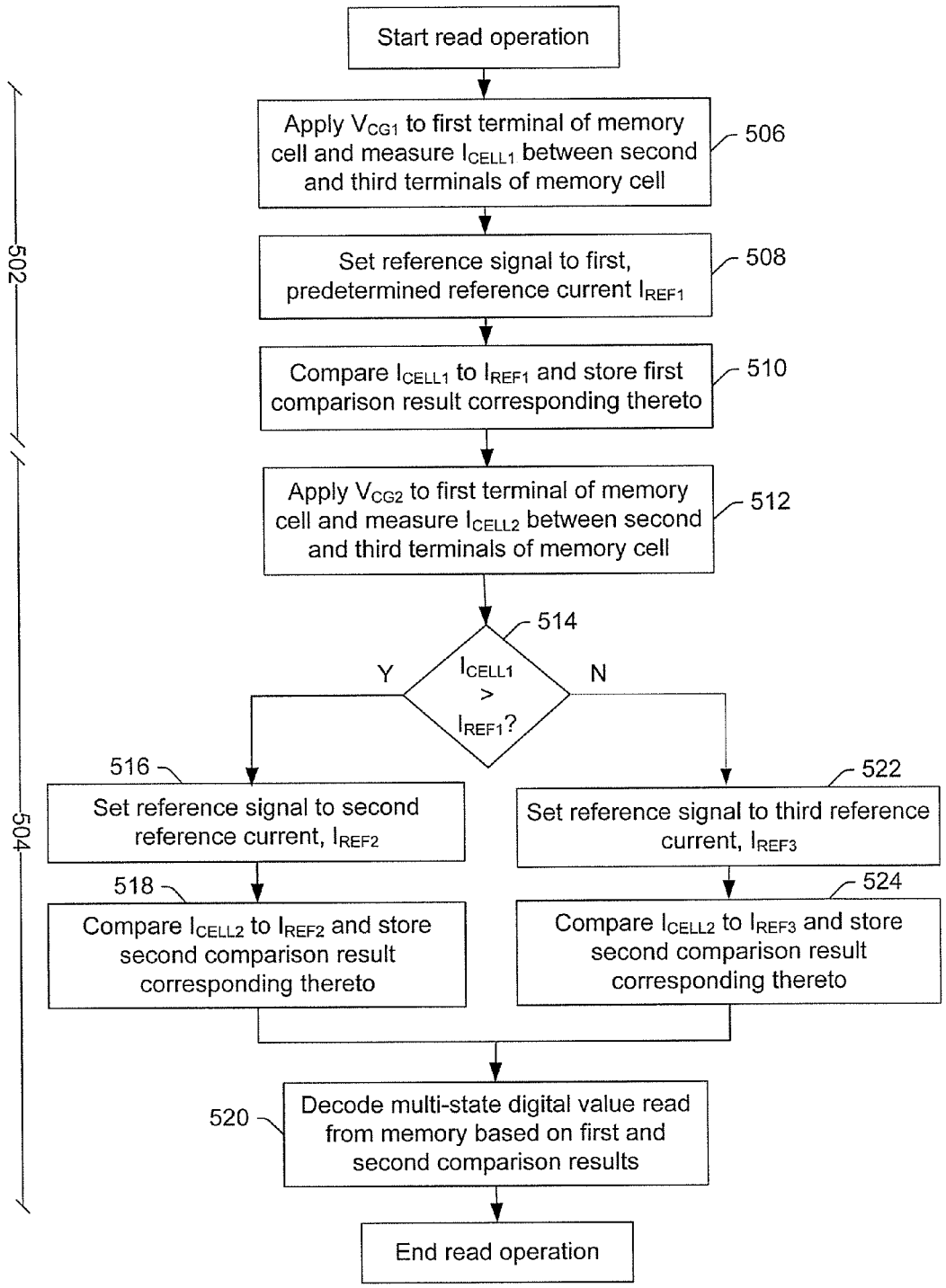
FIG. 5 is a flow chart of a read operation for reading multi-state data in accordance with some embodiments.

FIG. 5 shows a hybrid read operation 500 in accordance with some embodiments. The hybrid read operation is essentially a two step process, although one or both of these two steps could be carried out as multiple steps in other embodiments. The first step 502 uses a first, predetermined control voltage ($V_{CG1}$) to measure a first read current ($I_{CELL1}$), which is compared to a first reference current ($I_{REF1}$) to determine a first comparison result. Then, in a second step 504, a new control voltage is applied ($V_{CG2}$), the current from the cell is re-measured ($I_{CELL2}$), and the re-measured current is compared to a new reference current level which depends on the result of the first measurement (e.g., $I_{REF2}$ or $I_{REF3}$) to provide a second comparison result. Near the end of the second step 504, a multi-state digital value read from the memory cell is decoded based on the first and second comparison results.

More particularly, the method starts at 506, where a first control voltage ($V_{CG1}$) is applied to a first terminal (e.g., control gate or wordline) of a three terminal memory cell, and a first current $I_{CELL1}$ flowing between the second and third terminals of the memory cell is measured. In 508, the reference signal is set to a first, predetermined reference current $I_{REF1}$. In 510, the method compares the first current measured $I_{CELL1}$ with the first, predetermined reference current $I_{REF1}$, and stores a first comparison result corresponding thereto.

At 512 a second control voltage ($V_{CG2}$) is applied to a first terminal (e.g., control gate or wordline) of a three terminal memory cell, and a second current $I_{CELL2}$ flowing between the second and third terminals of the memory cell is measured. At 514, the method 500 compares the first measured current $I_{CELL1}$ to a first reference current $I_{REF1}$. If $I_{CELL1}$ is greater than $I_{REF1}$ ('Y' at 514), the method proceeds to 516 where the reference signal is then set to a second predetermined reference current ($I_{REF2}$); and at 518 $I_{CELL2}$ and $I_{REF2}$ are compared to provide a second comparison result. The method then proceeds to 520, where a multi-state digital value read from the memory cell is decoded based on the first and second comparison results.

If, by contrast, $I_{CELL1}$ is not greater than $I_{REF1}$ (N at 514), the method proceeds to 522. At 522 the reference signal is then set to a third predetermined reference current ($I_{REF3}$); and at 524 $I_{CELL3}$ and $I_{REF3}$ are compared to provide a second comparison result. The method then continues to 520, where a multi-state digital value read from the memory cell is decoded based on the first and second comparison results.

Figure 6:
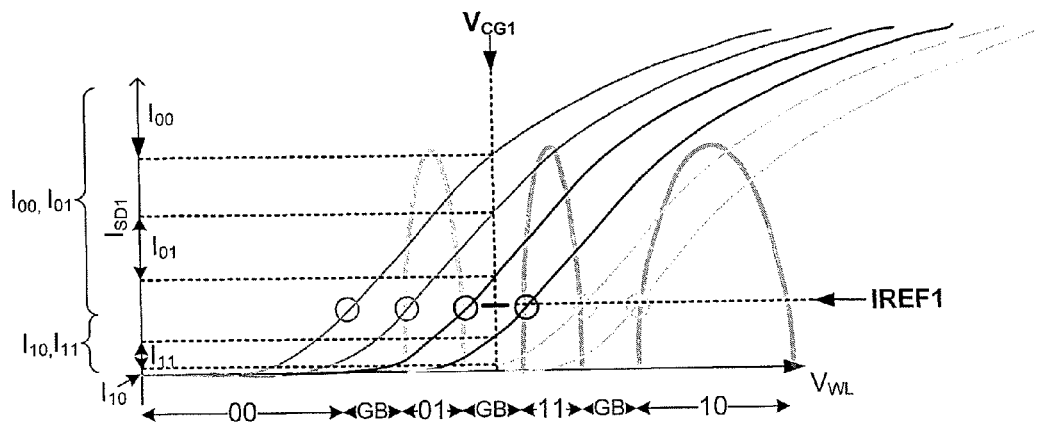
FIGS. 6-7 are voltage distribution charts showing first and second steps, respectively, of a read operation for reading multi-state data in accordance with FIG. 5's flow chart.
Figure 7:
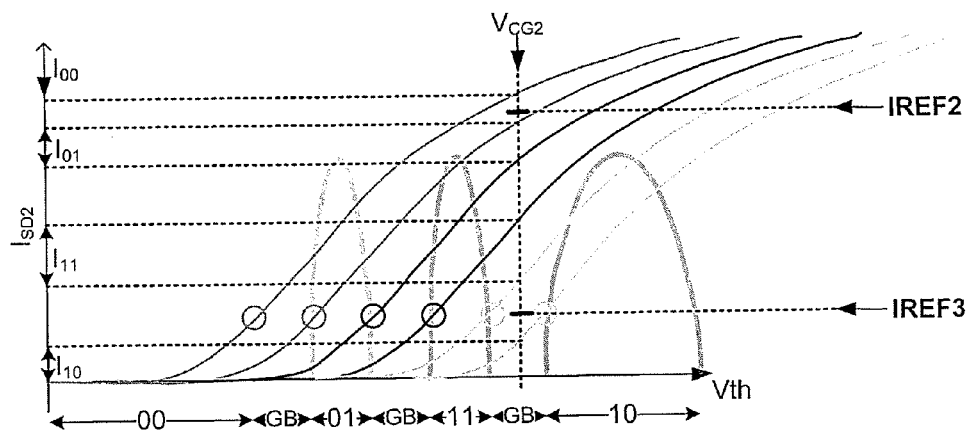

FIGS. 6-7 show a hybrid read operation which is consistent with FIG. 5's methodology. FIG. 6 is a first step in the read operation, and FIG. 7 is a second step in the read operation.

In FIG. 6, a reference current signal is set to current level IREF1, and the control gate voltage is set to VCG1. While the control gate is held at VCG1, $I_{SD1}$ flowing between source and drain is measured. As shown, the exact current measured depends on the data state stored in the multi-state cell. In FIG. 6's example, for instance, state 00 corresponds to a first current range ($I_{00}$); state 01 corresponds to second current range ($I_{01}$); state 11 corresponds to a third current range ($I_{11}$); and state 10 corresponds to a fourth current range ($I_{10}$, which has very low or approximately zero current at VCG1). The method compares the first measured current $I_{SD1}$, which can be in any one of the current ranges, to $I_{REF1}$ to provide a first comparison result, which determines whether cell is in one of two "fuzzy" logic states. If the first measured current $I_{SD1}$ is greater than $I_{REF1}$, the method determines the memory cell is in the first fuzzy logic state $I_{00}$, $I_{01}$. In contrast, if the first measured current $I_{SD1}$ is less than $I_{REF1}$, then the memory cell is in the second fuzzy logic state $I_{10}$, $I_{11}$.

In FIG. 7, the control gate voltage is changed to the second predetermined voltage $V_{CG2}$ and the current flowing between source and drain is re-measured ($I_{SD2}$). If in fuzzy logic state $I_{00}$, $I_{01}$ then if $I_{SD2}$ is greater than $I_{REF2}$, the to-be-determined data state is "00"; else the to-be-determined data state is "01." On the other hand, if in fuzzy logic state $I_{10}$, $I_{11}$ then if $I_{SD2}$ is greater than $I_{REF3}$, the to-be-determined data state is "11"; else the to-be-determined data state is "10." In this way, the hybrid read operation can decode multi-bit digital values stored in the memory cell in an efficient way.

In particular, in many embodiments, the reference currents IREF1 and IREF3 can be the same, which limits the amount of hardware required to implement the hybrid read scheme in FIG. 6-7. Compared to other solutions where three different reference current signals are used, the use of a single reference current for IREF1 and IREF3 can save area on an integrated circuit Having just two different control voltages VCG1 and VCG2 limits the amount of hardware required to implement the hybrid read scheme, compared to other solutions where three different control voltages are used, particularly if large area charge pumps are used to provide the control voltages.

Although some embodiments have been discussed above where a multi-state memory cell includes 4 data states, it will be appreciated that, in general, a multi-state memory cell can store any number of data states greater than two. For example, some embodiments of multi-state memory cells can store 3 states, 4 states, 5 states, 6 states, and so on. In some embodiments, each multi-level data storage element is configured to store a binary number of data states (e.g., $2^N$ data states therein), where the number of digital bits N is greater than one. In some such instances, the control circuit is configured to provide $2^N-1$ reference signals, often in the form of reference voltages set in respective guard bands between neighboring data states. The control circuit is configured to use the N−1 comparison results to determine an N-bit digital value corresponding to the to-be-determined data state. The first reference signal can correspond to a central guard band, and successive reference signals can be mid-way between the most recently applied guard band and an end of the voltage distribution, such that an N-bit digital value can be read in N steps. For example, N=3 (a three bit digital value) represents $2^3=8$ data states, wherein $2^3-1=7$ reference signals are arranged in respective guard bands between neighboring data states. To determine the particular 3-bit digital value stored in this cell, N=3 comparisons are made between the read current from a memory cell and respective reference currents, and based on these comparisons, the 3-bit digital value can be accurately determined.

Figure 8:
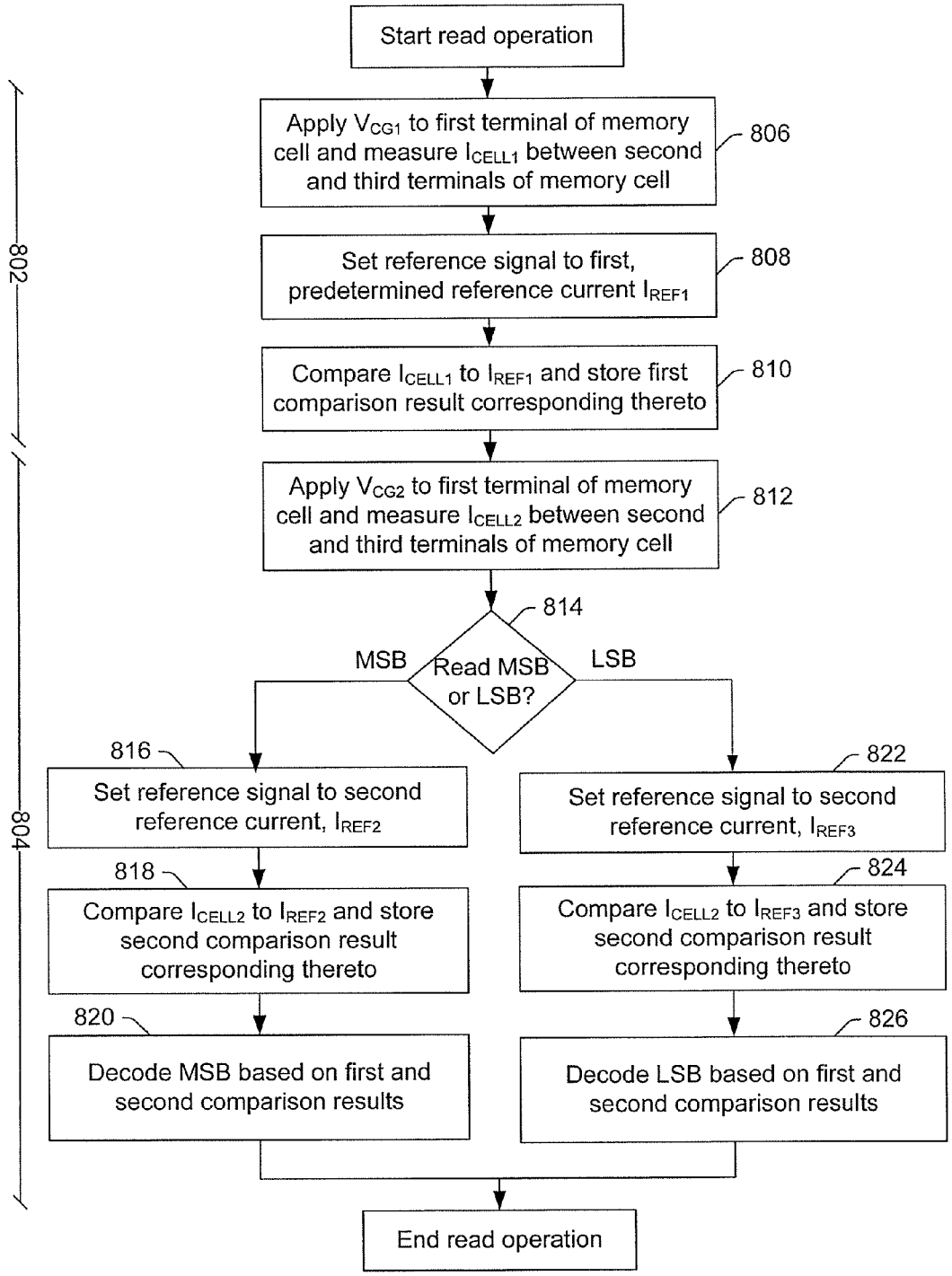
FIG. 8 is a flow chart of a read operation for reading a most significant bit (MSB) or least significant bit (LSB) of a multi-state memory cell in accordance with other embodiments.
Figure 9:
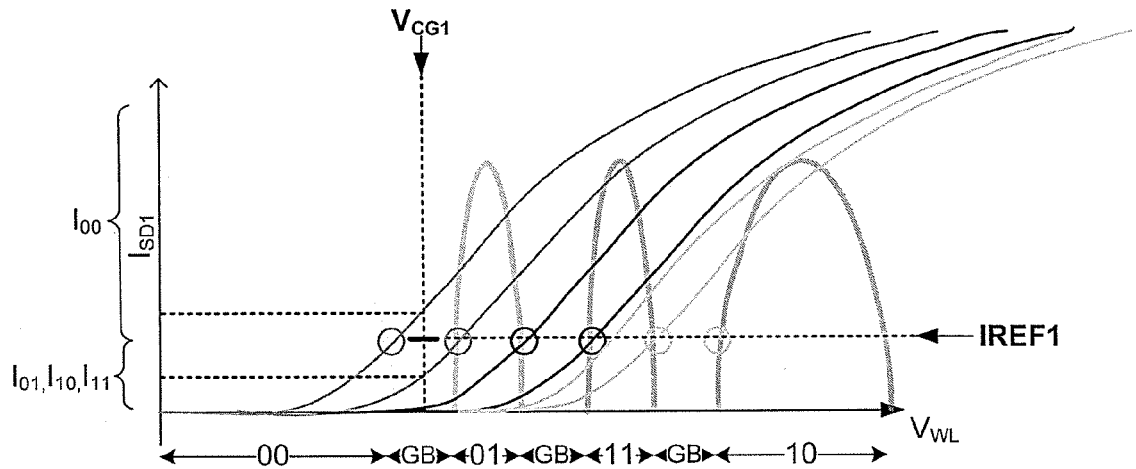
FIGS. 9-10 are voltage distribution charts showing first and second steps, respectively, of a read operation for reading an MSB or LSB of a multi-state memory cell in accordance with FIG. 8's flow chart.
Figure 10:
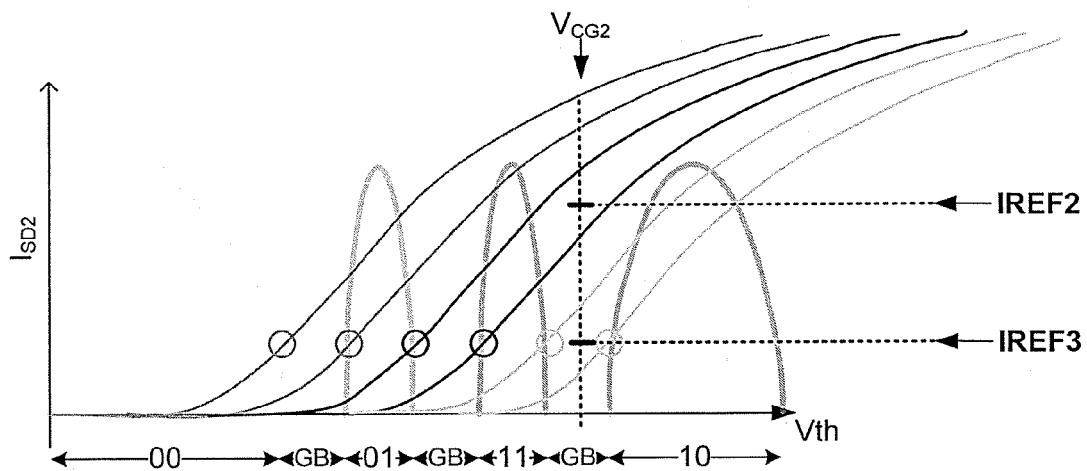

FIGS. 8-10 show another embodiment where a most-significant bit or least significant bit, although not necessary all bits, of a multi-state memory cell is read. In some instances, this operation can be carried out symmetrically with respect to current and power, and thus, may find utility in security applications. FIG. 8 shows this technique in flowchart format, while FIGS. 9-10 show an example of this technique with regards to voltage threshold distribution images.

In FIG. 9, the control gate voltage is set to a first voltage level (VCG1), which corresponds to a lowermost guard band. With VCG1 applied to the control gate, a first current between the second and third terminals of the memory cell is measured ($I_{SD1}$). If the first measured current ISD1 is greater than a first reference current IREF, then the cell is in state "00". Thus, in approximately 25% of instances for a 4-state memory cell (assuming random data is stored in the memory array), this first measured current will be determinative of the MSB and LSB bit stored in the cell. In the other 75% of instances, the cell is in fuzzy logic state $I_{01}, I_{10}, I_{11}$ and it is necessary to carry out another comparison operation to determine the LSB or MSB. To preserve the mentioned symmetry with regard to current and power as well as with regard to timing, this other comparison operation has to be performed, even if already the state $I_{00}$ is determined.

In FIG. 10, if the LSB stored in the memory cell is to be unambiguously determined, the control gate voltage is set to VCG2, which corresponds to the guard band between $I_{01}$ and $I_{10}$. Thus, if the measured current ISD2 is greater than IREF2, the MSB is a "0"; otherwise the MSB is a "1".

By contrast, if the MSB stored in the memory cell is to be unambiguously determined, the control gate is set to VCG3, which corresponds to the guard band between $I_{10}$ and $I_{11}$. Thus, if the measured current ISD3 is greater than IREF3, the LSB is a "0"; otherwise the LSB is a "1".

Figure 11:
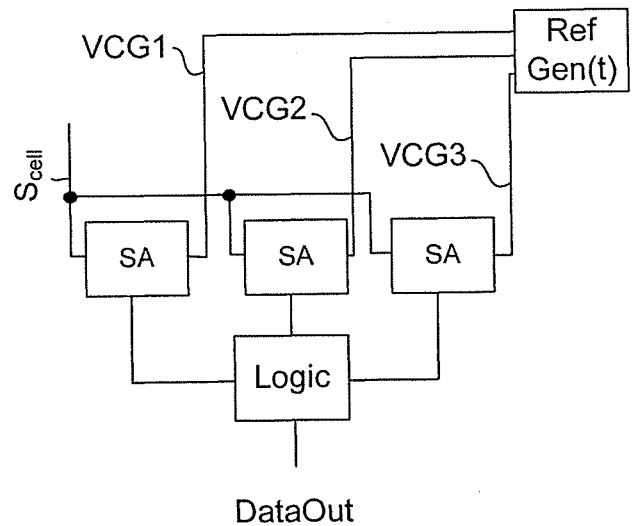
FIG. 11 is a block diagram of a conventional read circuit that suffers from some shortcomings.

FIG. 11 shows an example conventional read operation for a 4-state memory cell that suffers from some shortcomings. In particular, FIG. 11 shows a state distribution of memory cells of a memory array, wherein each memory cell is in one of four states at any given time.

In FIG. 11, each column has three sense amps that each receives a different fixed reference signal. The first sense amp compares the to-be-determined state to the first fixed reference signal, the second sense amp compares the to-be-determined state to the second fixed reference signal, the third sense amp compares the to-be-determined state to the third fixed reference signal. Combinatory logic or a state machine then compares the results from the three sense amps to determine the multi-bit value corresponding to the to-be-determined state. This technique provides relatively fast reads (high data performance), but suffers in that it requires a significant amount of hardware due to the multiple sense amps. This increase in hardware makes this solution more expensive, and potentially limits battery lifetime for mobile devices due to the increased number of gates. Hence, the disclosed hybrid read scheme has limited hardware in that only a single sense amp is required. Thus, the disclosed hybrid reading techniques provide good tradeoffs between performance, cost, and power concerns.

Figure 12:
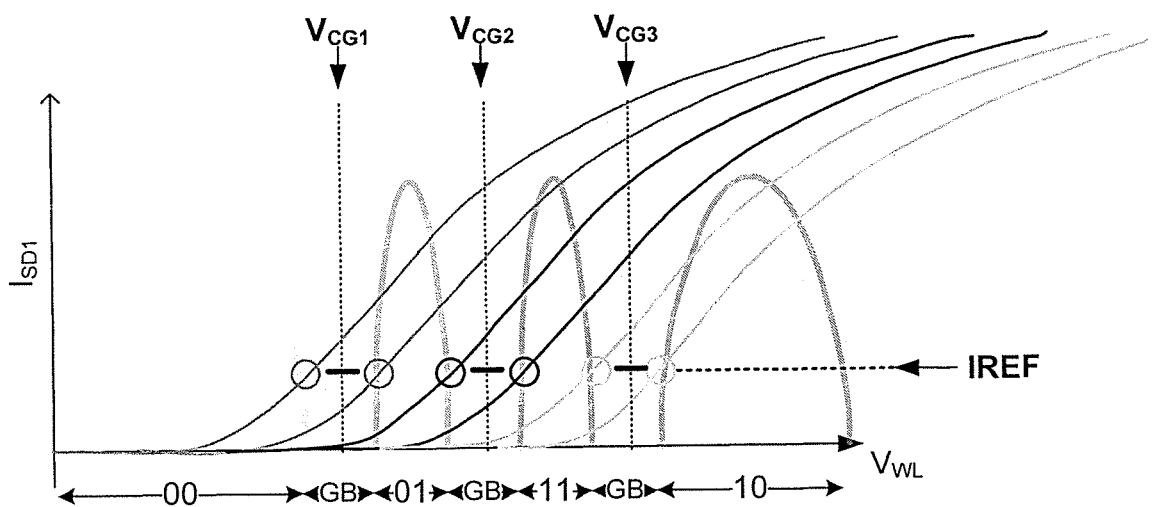
FIG. 12 is a voltage distribution chart showing a conventional read operating that suffers from some shortcomings.

In another conventional embodiment (not shown), a single sense amp can utilized while three different control voltages $V_{CG}$ are applied in successive fashion. To perform a single read operation, the to-be-determined state read from the memory cell (e.g., on BL coupled to accessed cell), is first compared to VCG1, Iref, then compared to VCG2, IREF, and then compared to VCG3, IREF in rapid succession as shown in FIG. 12. For each read operation, the voltage/current comparisons are made in the same order regardless of what values are measured. After these comparisons have been made, the multi-bit value corresponding to the to-be-determined state can be determined. An advantage of this solution is that the single sense amp limits the amount of hardware somewhat, which reduces the cost of the part and provides good battery lifetime for mobile devices. However, a disadvantage of such a solution is that reading operations are relatively slow, due to the 3 sense/compare operations respectively associated with the three different control voltages. Hence, compared to this conventional technique, the disclosed hybrid read scheme is relatively fast because it only uses two sense/compare operations (rather than 3 compare operations) in the 4-state context.

Although the disclosure has been shown and described with respect to one or more implementations, equivalent alterations and modifications will occur to others skilled in the art based upon a reading and understanding of this specification and the annexed drawings. For example, although several examples have been discussed herein with regards to flash memory cells to ease understanding, it will be appreciated that the present disclosure is not limited to flash memory cells and is applicable to any multi-state memory cell. The disclosure is particularly applicable to multi-state memory cells having at least three terminals therein, although memory cells with additional terminals may also make use of the disclosed techniques.

Further, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A method of reading a data state stored in a multi-state memory cell configured to store at least three data states therein, wherein respective neighboring data states are separated by respective guard bands, the method comprising:
providing a read signal from the cell, where the read signal is indicative of a to-be-determined data state corresponding to one of the at least three data states stored in the memory cell;
setting a reference signal to a first, predetermined reference value corresponding to a first guard band;
comparing the read signal to the first, predetermined reference value to obtain a first comparison result;
setting the reference signal to a second reference value, which corresponds to a higher or lower guard band relative to the first guard band, based on the first comparison result;
comparing the read signal to the second reference value to ascertain a digital value of the to-be-determined data state read from the memory cell.

2. The method of claim 1, wherein the read signal is a read current signal and wherein the reference signal is a reference current signal.

3. The method of claim 2, wherein the first and second reference values for the reference current signal have equal current levels.

4. The method of claim 1, wherein the first, predetermined guard band is a central guard band, and the higher or lower guard band is approximately mid-way between the central guard band and an end of the voltage distribution.

5. The method of claim 1, wherein the multi-level data storage element is configured to store $2^N$ data states therein which represent N bits, and wherein a read operation for the multi-level data storage element takes N comparisons between the read signal and the reference signal.

6. A memory device, comprising:
a memory cell including a multi-level data storage element configured to store more than two data states therein;
a bitline coupled to the multi-level data storage element and configured to carry a read signal there from, where the read signal is indicative of a to-be-determined data state read from the memory cell;
a sense amp coupled to the bitline and configured to provide comparison results which are based on respective comparisons between a reference signal and the read signal during a read operation; and
a control circuit to, at a first time in the read operation, set the reference signal to a first reference value to induce determination of a first comparison result, and to, at a second subsequent time in the read operation, set the reference signal to a second reference value based on the first comparison result to induce determination of a second comparison result.

7. The memory device of claim 6, wherein the multi-level data storage element is configured to store $2^N$ data states therein, wherein N>1 and wherein N represents the number of bits stored in the multi-level data storage element.

8. The memory device of claim 7, wherein the control circuit is configured to provide $(2^N)-1$ reference signals.

9. The memory device of claim 8, wherein for a given read operation, comparisons between the read signal and only N of the $(2^N)-1$ reference signals are used to determine an N-bit digital value for the given read operation.

10. The memory device of claim 9, wherein N=2.

11. The memory device of claim 7, wherein the control circuit is configured to provide $(2^N)-1$ reference signals in the form of reference voltages set in respective guard bands between neighboring data states.

12. The memory device of claim 11, wherein the first reference signal corresponds to a central guard band, and the second reference signal corresponds to a guard band approximately mid-way between the central guard band and an end of the voltage distribution.

13. The memory device of claim 12, wherein N bits stored in the multi-level data storage elements are determined by comparisons between the read signal and only N reference signal for a given read operation.

14. The memory device of claim 7, wherein the first reference value corresponds to a location of a non-central guard band in the $2^N$ data states.

15. The memory device of claim 13, wherein the second reference value is set to a location of a second guard band and which allows determination of either a most significant bit or a least significant bit of the multi-bit digital value.

16. The memory device of claim 6, wherein the read signal is a read current signal and wherein the reference signal is a reference current signal; and
wherein the first and second reference values for the reference current signal have equal current levels.

17. A memory device, comprising:
a memory cell including a multi-level data storage element configured to store more than two data states therein, wherein the multi-level data storage element comprises:
a first, control terminal on which a control voltage is provided and second and third terminals between which a current is measured, wherein the current is dependent on the control voltage and a to-be-determined data state stored in the multi-level data storage element;
a bitline coupled to the second terminal of the multi-level data storage element;
a sense amp coupled to the bitline and configured to provide comparison results which are based on respective comparisons between a reference current signal and the current read from the multi-level data storage element during a read operation; and
a control circuit to, at a first time in the read operation, set the reference current signal to a first reference current value to induce determination of a first comparison result, and to, at a second subsequent time in the read operation, set the reference current signal to a second reference current value based on the first comparison result to induce determination of a second comparison result.

18. The memory device of claim 17, wherein the multi-level data storage element is configured to store $2^N$ data states therein, N>1.

19. The memory device of claim 18, wherein the control circuit is configured to provide (2^N)−1 reference current signals.

20. The memory device of claim 19, wherein for a given read operation, comparisons between the read current signal and only N of the (2^N)−1 reference current signals are used to determine an N-bit digital value for the given read operation.

21. A method of ascertaining a to-be-determined data state from a multi-level data storage element having a first control terminal and second and third terminals, the method comprising:

applying a first control voltage to the control terminal and concurrently measuring a first read current across the second and third terminals, where the first read current is indicative of the to-be-determined data state;

comparing the first read current to a first predetermined reference current, which corresponds to a first guard band, to obtain a first comparison result;

applying a second control voltage to the control terminal and concurrently measuring a second read current across the second and third terminals, wherein the second read current is indicative of the to-be-determined data state;

comparing the second read current to a second predetermined reference current, which corresponds to a higher or lower guard band relative to the first guard band, to obtain a second comparison result, where the second predetermined reference current has a current level that is set based on the first comparison result;

ascertaining the to-be-determined data state based on the first and second comparison results.

* * * * *